United States Patent [19]

Lane

[11] Patent Number: 4,928,103
[45] Date of Patent: May 22, 1990

[54] PARALLEL ANALOG-TO-DIGITAL CONVERTER USING $2^{(n-1)}$ COMPARATORS

[75] Inventor: Charles D. Lane, Greensboro, N.C.

[73] Assignee: Analog Devices, Inc., Norwood, Mass.

[21] Appl. No.: 408,278

[22] Filed: Sep. 18, 1989

[51] Int. Cl.$^5$ .............................................. H03M 1/36
[52] U.S. Cl. ..................................... 341/159; 341/160
[58] Field of Search ................ 341/158, 159, 160, 155

[56] References Cited

U.S. PATENT DOCUMENTS

| | | | |
|---|---|---|---|
| 3,877,025 | 4/1975 | Maio | 341/159 |
| 4,143,366 | 3/1979 | Lewis, Jr. | 341/160 |
| 4,591,825 | 5/1986 | Bucklen | 341/159 |
| 4,596,978 | 6/1986 | Fujita | 341/159 |
| 4,763,106 | 8/1988 | Gulczynski | 341/159 |

Primary Examiner—William M. Shoop, Jr.
Assistant Examiner—Howard L. Williams
Attorney, Agent, or Firm—Wolf, Greenfield & Sacks

[57] ABSTRACT

The invention comprises an n-bit analog-to-digital flash converter comprising $2^N/2$ input comparators, each having a first input coupled to receive the analog voltage to be converted and a second input coupled to a different reference voltage. The reference voltages of each consecutive input comparator are spaced apart two LSBs of the converter. Each input comparator has two output, OUT and an inverted version thereof, $\overline{OUT}$. $2^n-1$ consecutive latches are provided. Every other latch receives at its inputs the OUT and $\overline{OUT}$ signals from a single associated input comparator. All other latches receive the OUT signal of one of the input comparators and the $\overline{OUT}$ signal of an adjacent input comparator. The latches having inputs coupled to the OUT and $\overline{OUT}$ signals of a single input comparator produce a comparison output which change state every two LSBs of the converter and the latches having one input coupled to the OUT signal of one input comparator and the $\overline{OUT}$ signal of an adjacent input comparator produce comparison signals which change state halfway between the output signals of the adjacent latches. Thus, a comparison output is provided for every LSB of the full scale range of the converter using only $2^n/2$ input comparators.

6 Claims, 4 Drawing Sheets

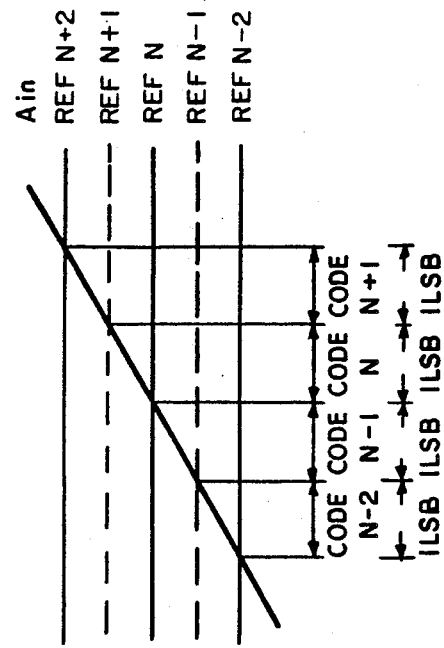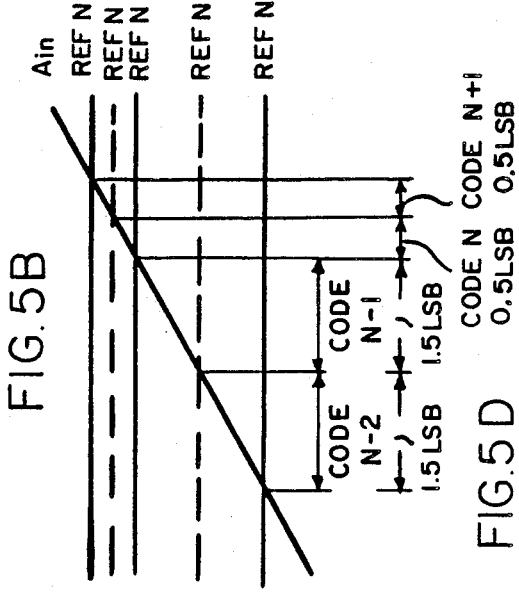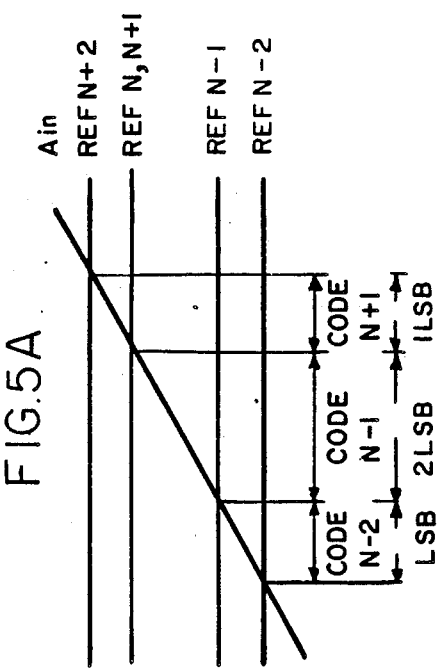

PARALLEL ANALOG-TO-DIGITAL CONVERTER USING $2^{(n-1)}$ COMPARATORS

FIELD OF THE INVENTION

The present invention relates to parallel analog-to-digital converters, more commonly known as flash converters. More particularly, the invention relates to high resolution flash converters having only $2^n/2$ comparators, where n is the number of bits of resolution of the converter.

BACKGROUND OF THE INVENTION

Flash converters are a particular type of analog-to-digital converter which can operate at extremely high speeds.

One prominent type of analog-to digital converter sequentially compares an analog input to a series of reference voltages until the reference voltage closest to the analog input voltage (within one least significant bit) is found. For instance, in a typical successive-approximation analog-to-digital converter, the analog input voltage is compared with a first reference voltage that is half the full scale range of the converter. If the analog input voltage is greater than the first reference voltage, then half of the first reference voltage is added to the first reference voltage to produce a second reference voltage. If the analog input is less than the first reference voltage, then half of the first reference voltage is subtracted from the first reference voltage to produce the second reference voltage. The second reference voltage is then compared to the analog input. The converter continues to add or subtract, as the case may be, smaller and smaller potentials to the reference voltage until the reference voltage matches the analog input voltage to within one LSB.

Flash converters can operate at substantially higher speeds than successive-approximation, or the like, converters because they compare the analog input voltage with every possible reference voltage simultaneously, all comparisons being done in parallel. Thus, the reference voltage which is closest to the analog input voltage is determined in the first and only comparison period.

FIG. 1 illustrates the circuitry of a typical parallel, or flash, converter. A typical n bit flash converter comprises $2^n-1$ input comparators, 14-1 through 14-m, where $m=2^n-1$. One input of each comparator is coupled to the analog input signal 12. The other input of each comparator is coupled to a different reference voltage. The reference voltages are spaced apart one LSB of the converter's full scale range. The analog input signal 12 is simultaneously compared by the $2^n-1$ comparators with every possible digitized value of the n-bit comparator's full scale range. Typically, the $2^n-1$ reference voltages are supplied by a fixed reference voltage 16 equal to the full scale range of the converter, provided to the inputs of the comparators 14-1 through 14-m through a reference resistive ladder as generally illustrated at 18. The resistance values of the reference resistance ladder are chosen such that the drop across each resistor is one LSB of the full scale range of the converter. Thus, each comparator compares the analog input voltage with one reference value for every possible digital value in the full scale range of the converter. In accordance with typical comparator operation, the comparators output a first logic level if the reference input is greater than the analog input and a second logic value if the reference input is less than the analog input. For instance, in a 10-bit flash converter having 1023 comparators, if the analog input voltage is 5 volts and the full scale range of the converter is 10 volts, then the outputs of comparators 14-1 through 14-512 will be of a first logic value and the outputs of comparators 14-513 through 14-1023 will be of a second logic value. The value of the analog input 12 is given by the highest numbered comparator outputting the first logic value, or, alternately, by the number of comparators outputting the first logic value. The flash converter includes encoding logic 20 which receives the outputs of the comparators 14 as its inputs and encodes the data received therefrom into a 10-bit code digitally representing the value of the analog input. A Gray code is commonly used; however, any digital code is acceptable.

U.S. patent application Ser. No. 07/283,791 for a Parallel Analog-to-Digital Converter assigned to the same assignee as the present invention discloses a flash converter architecture requiring a greatly reduced number of input comparators. The disclosure of that application is incorporated herein by reference. That application discloses a flash converter architecture which provides double the resolution over standard flash converter architectures by interpolating reference voltages between the outputs of the input comparators (the input comparators comprise differential pairs). The architecture disclosed herein is similar to the prior art parallel flash converter discussed in application Ser. No. 07/283,791, except that an additional latch is provided between each pair of adjacent latches. These additional latches compare the output of each input comparator (or differential pair) with the inverted output of the adjacent input comparator. As explained in application Ser. No. 07/283,791, the analog input voltage at which the output of an input comparator and the inverted output of an adjacent input comparator cross, so as to cause a change of state in the latch to which these two signals are supplied, occurs exactly halfway between the resistive ladder reference voltages supplied to the two adjacent input comparators. In this manner, a bonus threshold exactly halfway between every pair of adjacent reference voltages on the reference resistive ladder is obtained, without the need for additional input comparators or taps on the reference resistive ladder.

High resolution flash converters, even those employing the architecture disclosed in Application Ser. No. 283,791, require an extremely large number of comparators and associated logic as compared to other types of analog to-digital converters. Further, high resolution flash converters suffer from degradation of certain performance characteristics because of their specific architecture. For instance, in high resolution flash converter architectures such as 10-bit converters requiring 1023 comparator inputs from each of the analog input and the reference ladder, the input capacitance is very high and often is in excess of 100 pF. Due to the large input capacitance, the analog input node signal is very difficult to drive at high frequencies with existing buffers. The addition of the series resistances of the reference resistive ladder between the analog input and the buffer can often allow the buffer to drive the highly capacitive load; however, this resistance causes other problems, such as harmonic distortion produced across the series resistance by the analog input's voltage dependent capacitance.

Also, the static and dynamic base current errors of 1023 comparators create harmonic distortion produced by the "bow" of the reference resistance ladder.

In flash converters, differential non linearity is also a frequent problem. High resolution flash converter chips are very dense due to the high device count. Often, the chip is processed with poor device matching, which leads to poor differential linearity.

Therefore, it is an object of the present invention to provide a flash converter architecture with reduced analog input capacitance.

It is a further object of the present invention to provide a flash converter architecture with reduced voltage-dependent capacitance at the analog input.

It is another object of the present invention to provide a flash converter architecture capable of operating at high speeds and with low distortion.

It is yet one more object of the present invention to provide a flash converter architecture with reduced base current error in the reference resistance ladder.

It is a further object of the present invention to provide a flash converter architecture with improved differential linearity.

In general, it is thus an object of the present invention to provide an improved flash converter.

SUMMARY OF THE INVENTION

The foregoing objects are achieved in an n bit analog-to-digital flash converter which uses only $2^n/2$ input comparators. The converter comprises $2^n/2$ consecutive input comparators, each having a first input coupled to the analog input signal which is to be converted to digital form and a second input coupled to receive a reference voltage. The reference voltages supplied to each comparator are spaced apart two least significant bits (LSBs) of the converter's full scale range. The reference voltages can be provided by a fixed voltage supplied to the second input of each comparator through a reference resistance ladder. Each comparator has two outputs, OUT and $\overline{OUT}$. $\overline{OUT}$ is the inverse of OUT.

Each comparator supplies, through the OUT terminal, a first voltage level when its first input (the analog input signal) is greater than its second input (the associated reference voltage) and a second voltage level when its first input is less than its second input; the first output gradually changes from the first voltage level to the second voltage level when the two inputs are approximately equal. The $\overline{OUT}$ signal behaves similarly to the OUT signal, but with inverted voltage levels.

The OUT and $\overline{OUT}$ signals of the comparators are fed to $2^n-1$ latches in the manner described immediately below. $2^n/2$ of the latches receive at their inputs the OUT and $\overline{OUT}$ signals of a single associated input comparator. The remaining $(2^n/2)-1$ comparators receive the OUT signal of one comparator and the $\overline{OUT}$ signal of an immediately adjacent comparator. In this architecture, $2^n-1$ latches generate $2^n-1$ parallel comparison output signals using only $2^n/2$ input comparators. Each latched comparator's output will change from a first state to a second state as its two inputs cross the point where they are equal. Thus, the latches having inputs coupled to the OUT and $\overline{OUT}$ signal of a single input comparator will change output states when the analog input crosses the reference voltage input to the associated comparator. The remaining latches, i.e., the latches which receive the OUT signal from one comparator and the $\overline{OUT}$ signal from an adjacent comparator, change output states when the analog voltage crosses the point halfway between the reference voltages of the two adjacent comparators. Thus, only $2^n/2$ input comparators, $2^n/2$ voltage taps on the resistive ladder, $2^n/2$ taps from the analog input and $2^n-1$ latches are required in an n-bit flash converter constructed in accordance with the present invention.

The invention will be more fully understood from the detailed description below, which is presented by example and should be read in conjunction with the accompanying drawing.

BRIEF DESCRIPTION OF THE DRAWINGS

FIGS. 5A, 5B, 5C and 5D are plot diagrams illustrating the differential linearity error improvement of the present invention over the prior art.

DETAILED DESCRIPTION OF THE INVENTION

Figure 2:
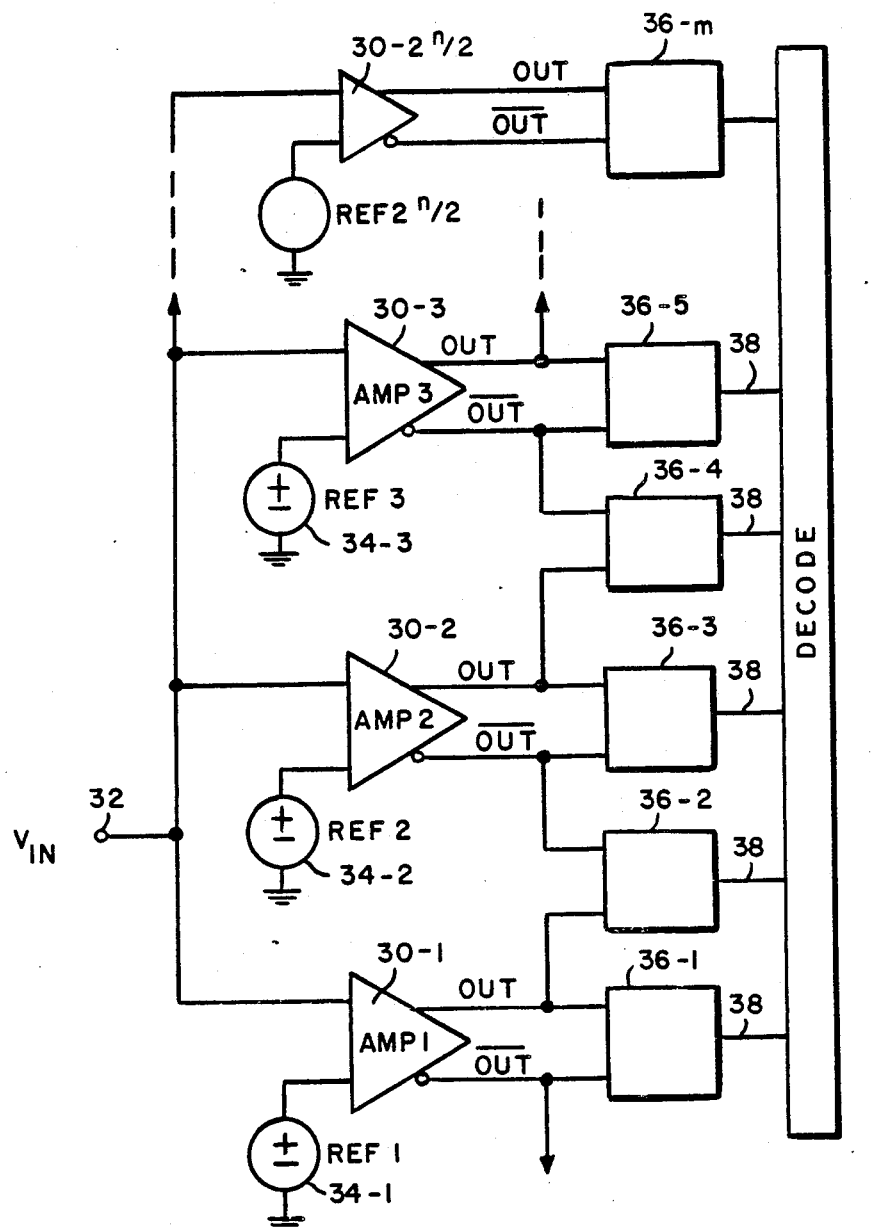
FIG. 2 is a block diagram of the flash converter architecture of the present invention.

FIG. 2 shows the architecture of the flash converter of the present invention. In an n-bit flash converter, there are provided $2^n/2$ input comparators 30-1 through 30-$2^n/2$ of which 30-1 through 30-5 and 30-$2^n/2$ are shown in FIG. 2. Each of said $2^n/2$ input comparators receives at a first input thereof the analog input signal Vin 32 which is to be converted to digital form. The other input of each input comparator 30 is coupled to a different reference voltage 34-1 through 34-$2^n/2$, of which only 34-1 through 34-5 and 34-$2^n/2$ are shown in FIG. 2. The reference voltages of adjacent input comparators are spaced apart by two LSBs of the converter. The reference voltages may be provided by a fixed voltage or current supplied to the inputs of the input comparators 30 through a resistive ladder (not shown).

Figure 3:
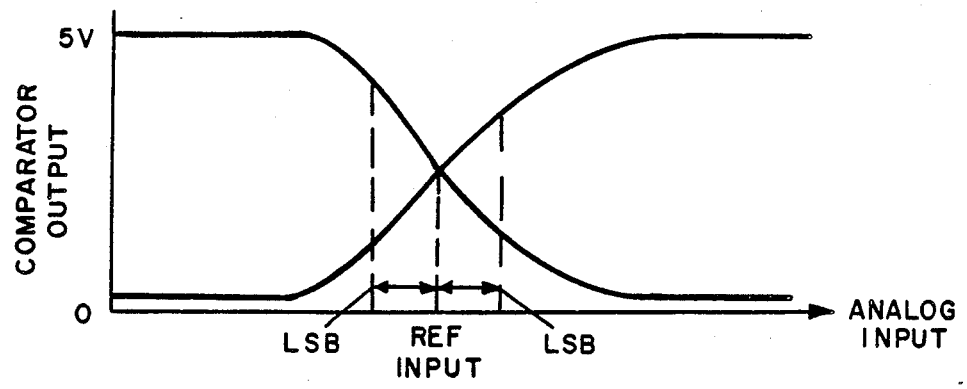
FIG. 3 is a plot diagram showing the relationship of the OUT and $\overline{OUT}$ signals of an input comparator of the present invention.

Each input comparator has two outputs, OUT and $\overline{OUT}$, which behave as shown in FIG. 3. FIG. 3 illustrates the outputs of comparators in the TTL; standard, however, it should be understood that other levels are possible. When the analog input is less than the reference input of any given input comparator, that comparator's OUT signal is at 0 volts and its $\overline{OUT}$ signal is at 5 volts. When the analog input signal is greater than the reference input, the logic levels of the outputs are inverted such that the OUT signal is at 5 volts and the $\overline{OUT}$ signal is at 0 volts. However, as illustrated in FIG. 3, the transition of each output signal from 0 to 5 volts or vice versa, does not occur instantaneously but rather occurs gradually when the analog input is in the immediate vicinity (i.e., 1 or 2 LSBs) of the reference signal. It can be seen in FIG. 3 that, at the point where the analog input and reference input are equal, the OUT and $\overline{OUT}$ signals cross. FIG. 3 also shows that, at 1 LSB to either side of the crossing point, the comparator outputs are within the transitional portion of the curves.

Referring again to FIG. 2, the flash converter architecture of the present invention further includes $2^n-1$ latches 36-1 through 36-m, where $m=2^n-1$ of which 36-1 through 36-5 and 36-m, are shown in FIG. 2. There is a latch 36 associated with each input comparator 30, e.g., 30-1, 30-3 and 30-5 as well as a latch between each pair of adjacent input comparators, e.g., 30-2 and 30-4. Each latch 36 which is coupled to receive the OUT and $\overline{OUT}$ signals of a single comparator operates as follows. Where the OUT and $\overline{OUT}$ signals of the associated input comparator 30 cross, the output of the associated latch 36 will change state. The OUT and $\overline{OUT}$ signals of the associated input comparator will cross when the analog input is equal to the reference voltage level which is provided to that input comparator 30. Thus, with the reference voltages of each comparator 30 spaced apart by two LSBs, the latches which receive the OUT and $\overline{OUT}$ signal of a single comparator 30 generate a comparison output signal 38 for every two LSBs of the converter.

Figure 4:
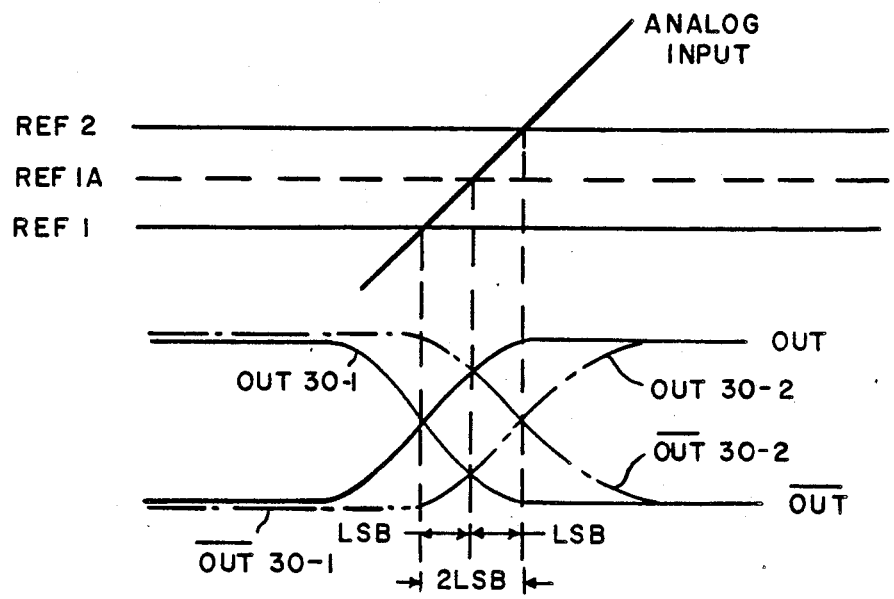
FIG. 4 is a plot diagram showing the relationship of the OUT and $\overline{OUT}$ outputs of two adjacent input comparators of the present invention.

The remaining conversion points, i.e., every other LSB, are provided by the outputs of the latches which receive inputs from two adjacent input comparators. Those latches, which accept the OUT signal from one comparator and the $\overline{OUT}$ signal from an adjacent comparator (hereinafter intermediate latches), operate essentially in the same manner as the latches described above. However, the point at which the OUT signal of one input comparator and the $\overline{OUT}$ signal of an adjacent input comparator cross is between the reference voltage inputs to the adjacent comparators. As illustrated in FIG. 4 and explained hereinafter, the point at which the $\overline{OUT}$ signal of an input comparator having a first reference input and the OUT signal of an adjacent comparator having a second reference input is exactly halfway between the first and second reference inputs. Therefore, with the reference inputs of adjacent comparators 30 spaced two LSBs apart, an intermediate latch 30-X produces a comparison output which change state one LSB above the reference input of the preceding comparator 36-X−1 and one LSB less than the reference input of the succeeding comparator 30-X+1.

The top portion of FIG. 4 shows the analog input voltage plotted against the reference voltages of two adjacent input comparators 30-1 and 30-2. The bottom portion of FIG. 4 shows a plot of the OUT and $\overline{OUT}$ signals of two adjacent comparators 30-1 and 30-2. The plot is essentially similar to that shown in FIG. 3 except that the output of two adjacent comparators are shown on a single graph. It can be seen that OUT 30-1 and $\overline{OUT}$ 30-1 cross at a voltage level equal to the reference voltage 34-1 which is supplied to the associated comparator 30-1. Likewise, OUT 30 2 and $\overline{OUT}$ 30-2 cross at a voltage equivalent to the reference voltage 34-2 which is input to that comparator 30-2. FIG. 4 further illustrates that OUT 30-1 and $\overline{OUT}$ 30-2 cross exactly halfway between reference voltage 34 1 and 34-2. FIG. 4 also illustrates that OUT 30-2 could be compared with $\overline{OUT}$ 30-1 to yield the exact same result. Thus, by comparing the OUT signal from one input comparator with the $\overline{OUT}$ signal of an adjacent input comparator, a bonus comparison output is generated exactly halfway between the reference inputs to the adjacent comparators. Thus, the flash converter architecture of the present invention provides a comparison output for every LSB in the full scale range of the n bit converter but requires only $2^n/2$ input comparators and $2^n-1$ latches as opposed to the prior art architectures which require $2^n-1$ input comparators and $2^n-1$ latches.

Referring again to FIG. 2, the outputs of the latches 38-1 through 38-n-1 are forwarded to decoding circuitry 40 which can be identical to the decoding circuitry used in the prior art since the outputs 38 of the latches are essentially identical to the comparison outputs of prior art flash converters.

There are many advantages to the flash converter architecture of the present invention in addition to the obvious advantages related to savings in number of components and cost of producing the flash converter. One of the most significant benefits of the present architecture relates to implementation of the disclosed architecture in high resolution flash converters (i.e., over about 8 bits). Since the present architecture uses half as many input comparators as prior art flash converters, the input capacitance which must be driven by the analog input signal is halved, greatly easing the burden on the analog input signal source. Also, since the comparators generate a voltage dependent capacitance at the analog input, this capacitive load is also halved. The voltage-dependent capacitance is a result of the base-collector junction capacitance of the input devices. Since the architecture of the present invention requires half the number of input comparators as the prior art architecture, the voltage-dependent capacitance is reduced accordingly. The resulting reduced analog input and voltage dependent capacitances allow monolithic buffers to present higher frequency signals with lower distortion than was previously possible with traditional flash converter architectures.

Another advantage of the disclosed architecture relates to the base current error in the reference ladder. Static and dynamic base current errors are also cut in half by the architecture of the present invention. As stated previously, the reference voltages are typically provided by a predetermined voltage or current supplied to the input comparators through a reference resistive ladder. The resistors in the reference resistive ladder are all equivalent in value, thus the voltage drop across each resistor should be equivalent (i.e., equal to two LSBs of the converter). However, a small base current is drawn into the input of each comparator (the base junction of one of the transistors of a differential pair) causing the current through each resistor in the reference resistive ladder to differ from the ideal equality. Thus, due to the base current error, the current drawn through each resistor is not equal and each reference voltage is not spaced exactly 2 LSBs apart. The non-linearity of the reference voltage produced by the resistive ladder (due to base current error) manifests itself as a bow in the output of the converter. The present invention decreases base current error by virtue of the fact that there are half as many input comparators as in the prior art. Thus, the base current error in the resistive ladder is essentially cut in half.

Another advantage is gained with the present architecture with respect to differential linearity performance. In flash converters, device mismatch is not uncommon, thereby leading to differential linearity errors in the output of the converter. One method known in the prior art to decrease component mismatch is to use large devices on the comparator inputs. However, this solution raises even further the analog input capacitance, thereby degrading system performance as described above.

FIGS. 5A, 5B, 5C and 5D show a comparison of differential linearity errors in traditional flash converter architecture and the architecture of the present invention and illustrate the improvement of the present invention. FIGS. 5A, 5B, 5C and 5D each show a plot of the analog voltage versus the reference voltage input of five consecutive input comparators 30-N−2 through 30-N+2. FIG. 5A shows the plot for an ideal prior art converter in which there is no differential linearity error. It is seen that the analog voltage crosses each consecutive reference voltage at precise one LSB intervals. FIG. 5B illustrates an ideal converter constructed in accordance with the present invention in which there is no differential linearity error. The thresholds are spaced one LSB apart as in FIG. 5A except that every other threshold is not represented by an actual, physical reference voltage but by a point halfway between the adjacent reference voltages.

FIG. 5C illustrates a prior art flash converter with a differential linearity error. In the example of FIG. 5C, reference voltage N is offset upwardly by exactly one LSB such that reference voltages N and N+1 are equal. Thus, since the analog voltage crosses two reference voltages simultaneously, one code of the $2^n$ possible codes can never be generated while the preceding code, i.e., for N−1, will be two LSBs wide. FIG. 5D illustrates how the same mismatch of one LSB, affects the linearity of a flash converter constructed in accordance with the present invention. First, note that reference levels N−1 and N+1 in FIG. 5D are interpolated levels and do not represent actual reference voltages. If reference voltage N is offset upwardly by one bit, the reference levels N−1 and N+1 adjacent thereto on either side are offset by half that amount, i.e. ½LSB. Thus, in the present flash converter architecture, reference level N−1 will be offset upwardly by half a bit, reference voltage N+1 will be offset upwardly by half a bit and reference level N will be offset upwardly by one bit. In the present architecture, every code still can be generated and the adjacent voltages are offset by half a bit. Thus, the present invention spreads out the differential linearity error among three LSBs, and unlike the prior art, no codes are lost.

Figure 1:
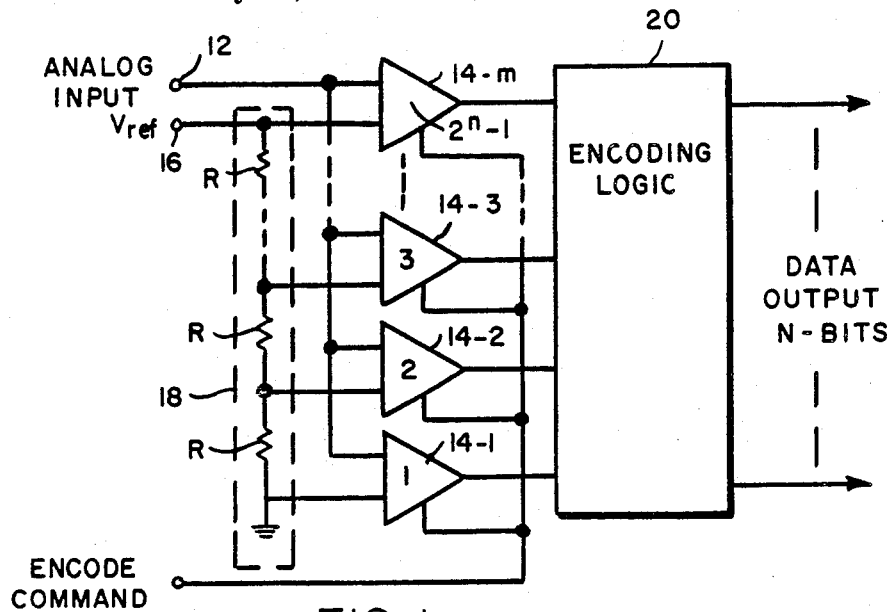
FIG. 1 is a partial block, partial schematic diagram of a prior art parallel analog to-digital flash converter.
Figure 6:
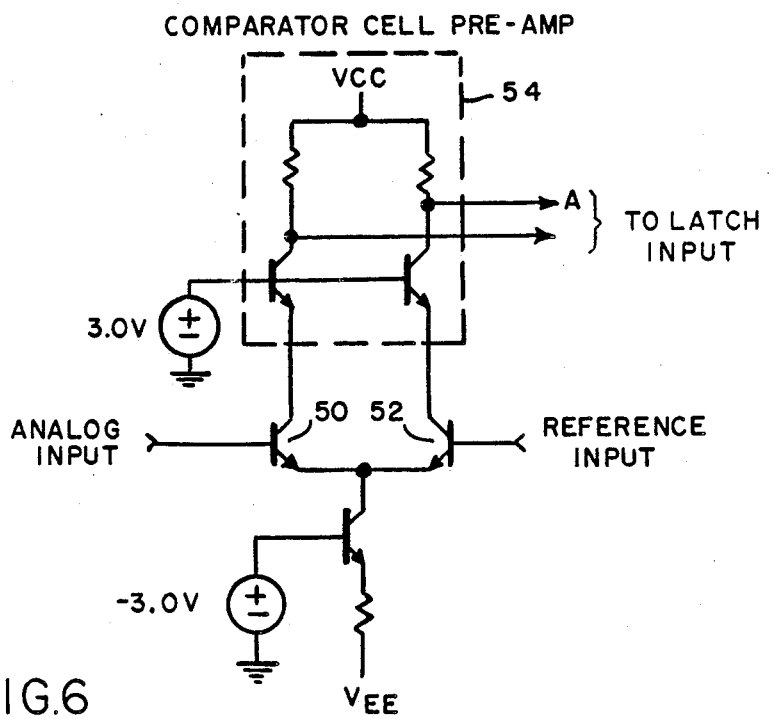
FIG. 6 is a schematic diagram of one preferred embodiment of the preamplifier cell of the input comparator of the present invention.

FIG. 6 is a simplified schematic diagram of one preferred embodiment of the input comparator's preamplifier cell. It comprises a pair of differentially coupled transistors 50 and 52 having their emitters coupled together and their bases coupled to the analog and reference inputs, respectively. A cascode stage 54 is placed above the input transistors 50 and 52 to reduce the effects of Miller multiplication. Assuming the converter normally operates with a 3.5 volt full scale input range centered about ground, the biasing of the cascode stage allows no less than 0.45 volts of base collector voltage on the input devices, therefore avoiding the most non-linear region of base collector capacitance.

Having thus described one particular embodiment of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. An analog-to digital flash converter for converting an analog signal to an n-bit digital signal, said converter comprising:

$2^n/2$ consecutive input comparators, each having a first input coupled to receive said analog signal, means for producing $2^n/2$ reference voltages spaced apart by two LSBs of said converter and for providing one each of said $2^n/2$ reference voltages to a second input of each input comparator, each of said input comparators having first and second outputs, said first output generally being at a first voltage level when said analog signal is greater than the associated reference signal and at a second voltage level when said analog signal is less than the associated reference signal and said first output gradually transitioning from said first output voltage level to said second output voltage level where said analog signal and said associated reference signal are approximately equal, and said second output being the inverse of said first output, and $2^n/2$ latch means, each associated with one of said input comparators and having first and second inputs for accepting said first and second outputs of said associated input comparator, $(2^n/2)-1$ additional latch means, each additional latch means having a first input coupled to receive said first output of one of said input comparators and a second input coupled to receive said second output of an input comparator adjacent said one of said input comparators, said latch means and additional latch means each having an output which is of a first latch output voltage when said first input thereto is less than said second input thereto and of a second latch output voltage when said first input thereto is greater than said second input thereto.

2. The flash converter of claim 1 further comprising: decode logic means coupled to receive the output of said latches and additional latches, said decode logic means processing said outputs of said latch means and additional latch means to produce a digitally coded N-bit output representing the value of said analog signal.

3. The flash converter of claim 2 wherein said digital coding is Gray's code.

4. The flash converter of claim 1 wherein said producing means comprises a reference resistance ladder.

5. The flash converter of claim 1 wherein said means for comparing comprise comparator amplifiers.

6. The flash converter of claim 1 further comprising; means for providing a latch pulse simultaneously to all said latch means and additional latch means, said latch means and additional latch means latching onto said inputs thereto in response to said latch pulse.

* * * * *